United States Patent [19]
Shaffer et al.

[11] Patent Number: 5,200,917
[45] Date of Patent: Apr. 6, 1993

[54] STACKED PRINTED CIRCUIT BOARD DEVICE

[75] Inventors: James M. Shaffer; Karl H. Mauritz; Glen Atkins, all of Boise, Id.

[73] Assignee: Micron Technology, Inc., Boise, Id.

[21] Appl. No.: 800,582

[22] Filed: Nov. 27, 1991

[51] Int. Cl.⁵ ............................................. G11C 13/00
[52] U.S. Cl. ........................................ 365/51; 365/52; 365/63
[58] Field of Search ................. 365/51, 52, 230.05, 365/63, 180.01

[56] References Cited

U.S. PATENT DOCUMENTS

| | | | |
|---|---|---|---|
| 4,656,605 | 4/1987 | Clayton | 365/52 |
| 4,701,777 | 10/1987 | Takayama et al. | 365/51 X |
| 4,727,513 | 2/1988 | Clayton | 365/52 |
| 4,763,298 | 8/1988 | Hoelzel et al. | 365/51 |
| 4,882,700 | 11/1989 | Mauritz et al. | 365/51 |
| 5,150,279 | 9/1992 | Collins et al. | 365/52 X |

Primary Examiner—Eugene R. LaRoche
Assistant Examiner—Do Hyun Yoo
Attorney, Agent, or Firm—Wells, St. John, Roberts, Gregory & Matkin

[57] ABSTRACT

The invention relates to a stacked integrated circuit module 20 which is interchangeable with standard printed circuit boards. Module 20 has two PCBs 22 and 24 and multiple memory ICs 26a-26d mounted on the PCBs. A board alignment support 48 is provided between PCBs 22 and 24 to support the PCBs in a spaced and substantially parallel relation and to provide electrical interfacing between the two PCBs. PCB 22 has an edge connector 44 adapted to be inserted into standard receptacle connectors provided on a mother board. According to this stacked arrangement, memory ICs 26c and 26d are addressable through connector 44, conductive paths formed on PCB 22, board alignment support 48, and conductive paths formed on PCB 24.

15 Claims, 2 Drawing Sheets

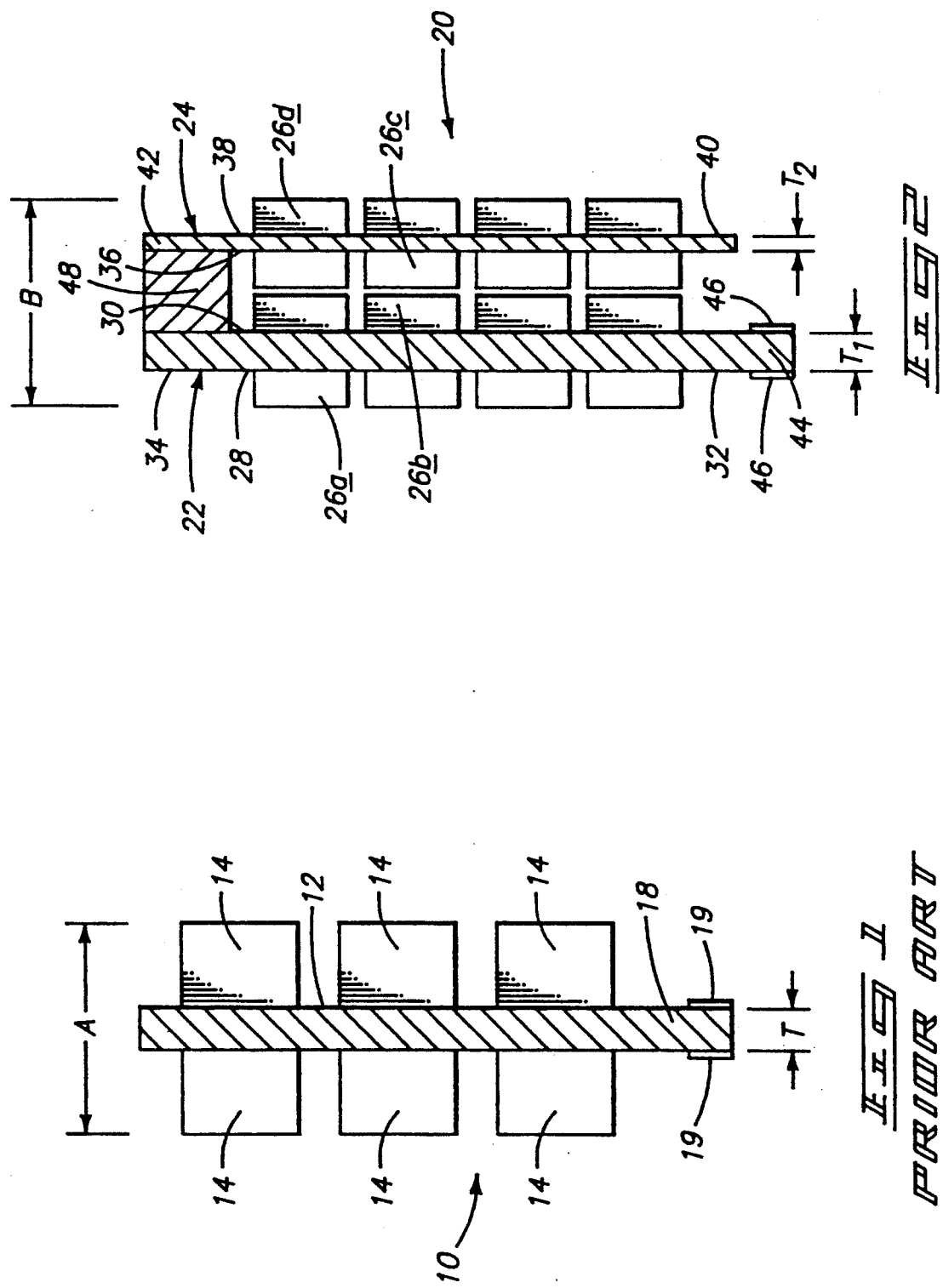

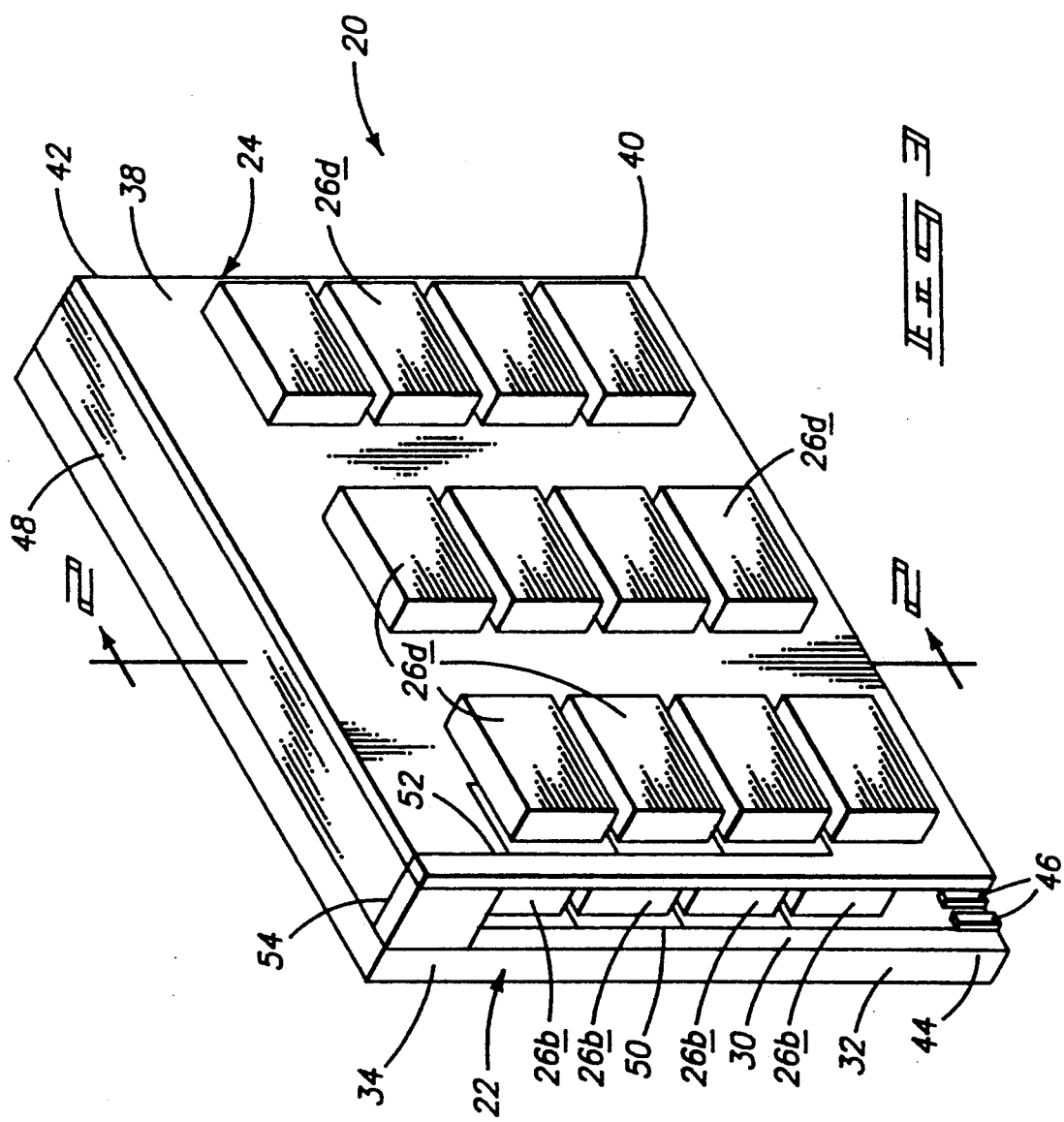

STACKED PRINTED CIRCUIT BOARD DEVICE

TECHNICAL FIELD

The invention relates generally to the mounting and interconnecting of printed circuit boards (PCBs) relative to one another.

BACKGROUND OF THE INVENTION

PCBs are often employed to carry multiple integrated circuits which are configured to do a particular function. For example, an array of memory integrated circuits, such as DRAMs, may be arranged on a PCB board to form a single in-line memory module (SIMM). The SIMM may then be inserted into a mother board of a personal computer to significantly expand memory capacity.

A constant goal in designing integrated circuit modules is to pack more integrated circuitry into the same or less space. This may be accomplished by physically scaling down the electrical components employed in the integrated circuits, such as decreasing the transistor gate size at the substrate level. Alternatively, printed circuit boards may be designed to carry more integrated circuits. With present PCB technology, integrated circuits may be mounted on both surfaces of the printed circuit board using through-hole or surface mount techniques. Unfortunately, the PCBs generally cannot be increased in length or height due to space limitations imposed by available areas on mother boards and within computer housings. Accordingly, mounting more integrated circuits onto the same PCB is increasingly more difficult since the external dimensions of the PCB (i.e., height and length) cannot be signicantly changed. Therefore, a need arises for new techniques to pack more integrated circuitry into the same area that is now occupied by double-sided PCBs.

Prior art PCBs have a standard thickness of 0.05 inch. A recent advancement in PCB technology has permitted the thickness of a PCB to be substantially reduced. At this writing, PCBs can be formed with a thickness of approximately 0.016 inch.

An advantage of the present invention is to design a novel stacking arrangement of printed circuit boards by incorporating the thinner PCB technology. The stacking arrangement permits a greater packing density of the integrated circuits into the same space occupied by conventional double sided PCBs. The stacked printed circuit board of the present invention allows a four-fold increase in memory density over prior art double sided memory PCBs, such as a prior art single in-line memory module (SIMM) board.

BRIEF DESCRIPTION OF THE DRAWINGS

The preferred embodiment of the invention is described below with reference to the following drawings:

FIG. 1 is a vertical sectional view of a prior art double sided PCB;

FIG. 2 is a vertical sectional view taken through line 2—2 in FIG. 3 of a stacked printed circuit board device according to the present invention; and FIG. 3 is a perspective view of the stacked printed circuit board device according to the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

According to an aspect of the present invention, a memory device for connection to a connector provided on a control board comprises:

a first printed circuit board having first and second surfaces;

connecting means for mating with a connector on a control board, the connecting means being provided at an end of the first printed circuit board;

a first memory circuit mounted on the first surface of the first printed circuit board;

a second memory circuit mounted on the second surface of the first printed circuit board;

the first printed circuit board having conductive paths formed on at least one of the first and second surfaces, the conductive paths electrically coupling the first and second memory circuits to the connecting means;

a second printed circuit board having first and second surfaces;

a third memory circuit mounted on the first surface of the second printed circuit board;

a fourth memory circuit mounted on the second surface of the second printed circuit board;

the second printed circuit board having conductive paths formed on at least one of the first and second surfaces, the conductive paths being electrically coupled to the third and fourth memory circuits;

a board alignment support conencted between the first and second printed circuit boards, the board alignment support supporting the first and second printed circuit boards in a spaced and substantially parallel relation;

interfacing means for electrically coupling the conductive paths on the first printed circuit board to the conductive paths on the second printed circuit board; and the third and fourth memory circuits being addressable through the connecting means, the conductive paths on the first printed circuit board, the interfacing means, and the conductive paths on the second printed circuit board when the device is mounted to a connector on a control board.

FIG. 1 shows a prior art integrated circuit module 10 having a double-sided PCB 12 and multiple integrated circuits 14 mounted on both surfaces of PCB 12. Module 10 further has an edge connector 18 formed along one edge of PCB 12 which mates with a receptacle connector provided on a control board (not shown). The control board may be a mother board in a personal computer, or some other dedicated controlling circuit employed in larger mainframe computers. Edge connector 18 has multiple conductive leads 19 formed thereon which electrically contact conductive leads provided in the receptacle connector. PCB 12 has a thickness T which is typically 0.050 inch.

Integrated circuits 14 are commonly mounted onto PCB 12 using a standard small out-line J-leaded (SOJ) packaging techniques. SOJ packages have a thickness of approximately 0.144 inch. Accordingly, a total thickness A of integrated circuit module 10 is typically 0.338 inch (i.e., 0.144+0.050+0.144=0.338 inch).

FIGS. 2 and 3 show an integrated circuit module 20 constructed in accordance with the present invention. Module 20 has two printed circuit board 22 and 24 and multiple integrated circuits (ICs) 26a–26d. PCB 22 has first surface 28, second surface 30, first end 32, and second end 34. Multiple ICs 26a and 26b are mounted respectively on first surface 28 and second surface 30 of PCB 22. Similarly, PCB 24 has first surface 36, second surface 38, first end 40, and second end 42. Multiple ICs 26c and 26d are mounted respectively on first surface 36 and second surface 38 of PCB 24.

Preferably, ICs 26a–26d are memory ICs, although other types of integrated circuits may be arranged on PCBs 22 and 24. Further, PCBs 22 and 24 may comprise specially dedicated memory modules, such as SIMMs. Additionally, a single memory IC may be mounted on each surface of PCBs 22 and 24 as opposed to having multiple ICs on each surface.

An edge connector 44 is connected to first end 32 of PCB 22. Edge connector 44 is adapted to mate with a connector provided on a standard control board (not shown). Edge connector 44 has multiple conductive leads 46 spaced evenly along at least one side thereof. Conductive leads 46 engage corresponding leads provided in the connector on the control board to electrically connect module 20 with the control board.

PCB 22 has a thickness $T_1$ which is preferably 0.050 inch. PCB 22 is therefore preferably the same thickness as prior art PCB 12 shown in FIG. 1. In this manner, module 20 is interchangeable with prior art module 10. PCB 24 has a thickness $T_2$ which is thinner than thickness $T_1$ of PCB 22. Preferably, PCB 24 has a thickness $T_2$ of approximately 0.016 inch.

Memory ICs 26a–26d are preferably packaged according to thin packaging techniques, including thin small outlined packages (TSOPs), tape automated bonding (TAB), or chip-on-board techniques. TSOP has a thickness of approximately 0.048 inch. TAB has a thickness of approximately 0.035 inch. Memory ICs mounted on the PCB using chip-on-board techniques has an even smaller thickness than TSOP or TAB. Chip-on-board profiles have a thickness of approximately 0.025 inch. Based on these packaging techniques, the greatest thickness of any one memory IC is 0.048 inch.

Module 20 has a board alignment support 48 connected between printed circuit boards 22 and 24. Board alignment support 48 separates PCBs 22 and 24 in a spaced and substantially parallel relation. Board alignment support 48 is preferably connected between adjacent ends 34 and 42 of PCBs 22 and 24, respectively. Board alignment support 48 may, however, be disposed between PCBs 22 and 24 at other locations, such as in the middle of the PCBs or at first ends 32 and 40 of PCBs 22 and 24, respectively.

Board alignment support 48 separates PCBs 22 and 24 by a distance less than approximately 0.11 inch, depending upon which packaging technique is employed. Most preferably, PCBs 22 and 24 are separated a distance of approximately 0.10 inch which is sufficient space for mounting adjacent back-to-back memory ICs 26b and 26c using TSOP techniques (i.e., 0.048+0.048=0.096 inch).

Module 20 has a total thickness B which is desirably less than 0.330 inch (the width available for expansion boards connected to control boards). Preferably, thickness B is approximately 0.266 inch or less, depending upon the IC package selected. Of course, the thickness of module 20 could be greater and still fall within the scope of the present invention.

PCB 22 has multiple conductive paths formed preferably on both first surface 28 and second surface 30, as represented by conductive path 50 (FIG. 3). Only one conductive path 50 is shown for clarity purposes. Conductive path 50 is formed on second surface 30 of PCB 22 and interconnects memory ICs 26b. Conductive path 50 further electrically couples memory ICs 26b to conductive leads 46 of edge connector 44. Similar conductive paths are formed on first surface 28 to interconnect memory ICs 26a, although these conductive paths are not shown in this view.

Likewise, PCB 24 has multiple conductive paths formed on first surface 36 and second surface 38 to provide access to memory ICs 26c and 26d. Conductive path 52 represents the multiple conductive paths formed on PCB 24. Conductive paths 52 provide electrical access to ICs 26c and 26d. Although conductive paths are preferably formed on both sides of the PCBs 22 and 24, conductive paths may be formed primarily on one of the surfaces on each PCB, whereby memory ICs mounted on the other surface are coupled to the conductive paths using through-hole techniques.

Board alignment support 48 also supports an interfacing means for electrically coupling the conductive paths circuit board 22 to the conductive paths on circuit board 24. In the preferred embodiment, board alignment support 48 carries multiple conductive paths, as represented by conductive path 54. Conductive path 54 may be formed on or in board alignment support 48 and is aligned to electrically couple conductive path 52 of PCB 24 and conductive path 50 of PCB 22. In another embodiment, interfacing means may be provided separately from board alignment support 48.

When module 20 is mounted to a connector on a control board, memory ICs 26c and 26d are addressable through edge connector 44, conductive path 50 on first PCB 22, conductive path 54 of board alignment support 48, and conductive path 52 of second PCB 24. Memory ICs 26a and 26b provided on first PCB 22 are addressable via edge connector 44 and conductive paths 50.

Due to the increase in memory resulting from the stacked arrangement, fan-out and the problems associated therewith are significantly greater. Accordingly, a memory driver may be mounted on one of the surfaces of the PCBs 22 and 24 to facilitate access to the individual memories 26a–26d and help reduce the problems associated with fan-out. The memory driver IC would be mounted in place of one of the memory ICs 26a–26d shown in FIGS. 2 and 3.

A method for addressing the memory ICs 26a–26d may be performed according to the method described in U.S. Pat. No. 4,882,700 to Mauritz et al., assigned to Micron Technology, Inc., which is incorporated herein by reference.

The module according to the present invention is advantageous over the prior art because more memory is packed into approximately the same area. In accordance with one aspect, the present invention allows up to four times as much memory as a prior art SIMM. In accordance with another aspect, PCB 22 has the same thickness as prior art double-sided PCB 12, making the present invention interchangeable with the prior art SIMM or the prior art double-sided PCB. In this manner, the module of the present invention can be connected to a control board connector which is adapted to receive the standard SIMM or double-side PCB.

In compliance with the statute, the invention has been described in language more or less specific as to structural and methodical features. The invention is not, however, limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A memory device for connection to a connector provided on a control board, the memory device comprising:
 a first printed circuit board having first and second surfaces;
 connecting means for mating with a connector on a control board, the connecting means being provided at an end of the first printed circuit board;
 a first memory circuit mounted on the first surface of the first printed circuit board;
 a second memory circuit mounted on the second surface of the first printed circuit board;
 the first printed circuit board having conductive paths formed on at least one of the first and second surfaces, the conductive paths electrically coupling the first and second memory circuits to the connecting means;
 a second printed circuit board having first and second surfaces;
 a third memory circuit mounted on the first surface of the second printed circuit board;
 a fourth memory circuit mounted on the second surface of the second printed circuit board;
 the second printed circuit board having conductive paths formed on at least one of the first and second surfaces, the conductive paths being electrically coupled to the third and fourth memory circuits;
 a board alignment support connected between the first and second printed circuit boards, the board alignment support supporting the first and second printed circuit boards in a spaced and substantially parallel relation;
 interfacing means for electrically coupling the conductive paths on the first printed circuit board to the conductive paths on the second printed circuit board; and
 the third and fourth memory circuit being addressable through the connecting means, the conductive paths on the first printed circuit board, the interfacing means, and the conductive paths on the second printed circuit board when the device is mounted to a connector on a control board.

2. A memory device according to claim 1 wherein the board alignment support is connected between adjacent ends of the first and second printed circuit boards opposite the end of the first printed circuit board at which the connecting means is provided.

3. A memory device according to claim 1 wherein the board alignment support is connected between adjacent ends of the first and second printed circuit boards opposite the end of the first printed circuit board at which the connecting means is provided, the board alignment support separating the first and second printed circuit boards by a distance less than approximately 0.11 inch.

4. A memory device according to claim 1 wherein the board alignment carries the interfacing means.

5. A memory device according to claim 1 further comprising a memory driver mounted on one of the surfaces of one of the first and second printed circuit boards.

6. A memory device according to claim 1 wherein the first printed circuit board has a thickness greater than a thickness of the second printed circuit board.

7. A memory device for connection to a connector provided on a control board, the memory device comprising:
 a first printed circuit board having first and second ends and first and second surfaces;
 connecting means for mating with a connector on a control board, the connecting means being connected to the first end of the first printed circuit board;
 a plurality of first memory circuits mounted on the first surface of the first printed circuit board;
 a plurality of second memory circuits mounted on the second surface of the first printed circuit board;
 the first printed circuit board having conductive paths formed on at least one of the first and second surfaces, the conductive paths electrically coupling the plurality of first memory circuits and the plurality of second memory circuits to the connecting means;
 a second printed circuit board having first and second ends and first and second surfaces, the second printed circuit board having a thickness less than a thickness of the first printed circuit board;
 a plurality of third memory circuits mounted on the first surface of the second printed circuit board;
 a plurality of fourth memory circuits mounted on the second surface of the second printed circuit board;
 the second printed circuit board having conductive paths formed on at least one of the first and second surfaces, the conductive paths being electrically coupled to the third and fourth memory circuits;
 a board alignment support connected between the second ends of the first and second printed circuit boards, the board alignment support supporting the first and second printed circuit boards in a spaced and substantially parallel relation;
 interfacing means connected between the second ends of the first and second printed circuit boards for electrically coupling the conductive paths on the first printed circuit board to the conductive paths on the second printed circuit board; and
 the third and fourth memory circuits being addressable through the connecting means, the conductive paths on the first printed circuit board, the interfacing means, and the conductive paths on the second printed circuit board when the device is mounted to a connector on a control board.

8. A memory device according to claim 7 wherein the board alignment support separates the first and second printed circuit boards by a distance less than approximately 0.11 inch.

9. A memory device according to claim 7 wherein the board alignment support carries the interfacing means.

10. A memory device according to claim 7 further comprising a memory driver mounted on one of the surfaces of one of the first and second printed circuit boards.

11. An integrated circuit device for connection to a connector provided on a control board, the integrated circuit device comprising:

a first printed circuit board having first and second surfaces;

connecting means for mating with a connector on a control board, the connecting means being provided at an end of the first printed circuit board;

a first integrated circuit mounted on the first surface of the first printed circuit board;

a second integrated circuit mounted on the second surface of the first printed circuit board;

the first printed circuit board having conductive paths formed on at least one of the first and second surfaces, the conductive paths electrically coupling the first and second integrated circuits to the connecting means;

a second printed circuit board having first and second surfaces;

a third integrated circuit mounted on the first surface of the second printed circuit board;

a fourth integrated circuit mounted on the second surface of the second printed circuit board;

the second printed circuit board having conductive paths formed onat least one of the first and second surfaces, the conductive paths being electrically coupled to the third and fourth integrated circuits;

a board alignment support connected between the first and second printed ciruit boards, the board alignment supporting the first and second printed circuit boards in a spaced and substantially parallel relation;

interfacing means for electrically coupling the conductive paths on the first printed circuit board to the conductive paths on the second printed circuit board; and the third and fourth integrated circuits being electrically accessible through the connecting means, the conductive paths on the first printed circuit board, the interfacing means, and the conductive paths on the second printed circuit board when the device is mounted to a connector on a control board.

12. An integrated circuit device according to claim 11 wherein the board alignment support is connected between adjacent ends of the first and second printed circuit boards opposite the end of the first printed circuit board at which the connecting means is provided.

13. An integrated circuit device according to claim 11 wherein the board alignment support is connected between adjacent ends of the first and second printed circuit boards opposite the end of the first printed circuit board at which the connecting means is provided, the board alignment supporting separating the first and second printed circuit boards by a distance less than approximately 0.11 inch.

14. An integrated circuit device according to claim 11 wherein the board alignment suppot carries the interfacing means.

15. An integrated circuit device according to claim 11 wherein the first printed circuit board has a thickness greater than a thickness of the second printed circuit board.

* * * * *